United States Patent [19]

Vötter

[11] Patent Number: 4,721,206
[45] Date of Patent: Jan. 26, 1988

[54] RACK FOR SEMI-FINISHED AND FINISHED PRODUCTS

[75] Inventor: Max Vötter, Malching, Fed. Rep. of Germany

[73] Assignee: Siemens Aktiengesellschaft, Berlin and Munich, Fed. Rep. of Germany

[21] Appl. No.: 924,102

[22] Filed: Oct. 31, 1986

Related U.S. Application Data

[63] Continuation of Ser. No. 791,006, Oct. 24, 1985, abandoned.

[30] Foreign Application Priority Data

Nov. 13, 1984 [DE] Fed. Rep. of Germany ....... 3441483

[51] Int. Cl.⁴ .............................................. B65D 73/02
[52] U.S. Cl. ..................................... 206/334; 206/328; 206/332
[58] Field of Search ............... 206/328, 330, 332, 334, 206/338, 340, 346, 248; 220/22, 68; 361/212, 220

[56] References Cited

U.S. PATENT DOCUMENTS

| | | | |
|---|---|---|---|
| 3,435,949 | 4/1969 | Soverkropp | 206/332 |
| 3,523,608 | 8/1970 | Miller | 206/330 |
| 3,737,031 | 6/1973 | Carroll | 206/328 |
| 3,915,307 | 10/1975 | Agarde | 211/41 |
| 3,966,043 | 6/1976 | Devroe | 206/423 |
| 4,327,832 | 5/1982 | De Matteo | 206/334 |
| 4,340,140 | 7/1982 | Wilcox et al. | 220/346 |
| 4,487,315 | 12/1984 | Azuma | 206/329 |
| 4,511,038 | 4/1985 | Miller et al. | 206/332 |
| 4,515,269 | 5/1985 | Hashimoto | 206/334 |
| 4,590,534 | 5/1986 | Akamatsu et al. | 206/328 |
| 4,592,481 | 6/1986 | Chen | 206/334 |
| 4,598,820 | 7/1986 | Murphy | 206/334 |

FOREIGN PATENT DOCUMENTS

| 38179 | 10/1981 | European Pat. Off. | 206/328 |
|---|---|---|---|
| 3230075 | 2/1984 | Fed. Rep. of Germany | 206/328 |

Primary Examiner—Joseph Man-Fu Moy
Assistant Examiner—David T. Fidei
Attorney, Agent, or Firm—John Francis Moran

[57] ABSTRACT

A rack for the production of semi-finished and finished products features an arrangement wherein two different clearance heights are provided respectively for the insertion of a pin coil former or the storage of the finished coil in the rack. Guide rails (4, 5) are adapted to accept a planar cardboard strip (9) to reduce the clearance height for the insertion of the pin coil former (10). Removal of the cardboard strip (9) increases the clearance height so the rack may be used to store the finished coil (15).

9 Claims, 3 Drawing Figures

RACK FOR SEMI-FINISHED AND FINISHED PRODUCTS

CROSS-REFERENCE TO RELATED APPLICATION

This is a continuation of Ser. No. 791,006 filed 10/24/85, now abandoned.

BACKGROUND OF THE INVENTION

This invention relates to a rack for semi-finished and finished products. More particularly, the invention relates to production racks for electrical pin coil formers, with coil former pins secured to a coil former flange, and for coils fitted with these coil formers. These production racks may be used both as a transport rack for the semi-finished products, e.g. pin coil formers, and as a packing rack for the finished products, e.g. coils, and is designed as a sectional rail with a tunnel-shaped cross-section roughly adapted to the product.

In conventional practices, it was typical practice for the manufacturer of the electrical pin coil formers to place the coil formers on primary laminar plastic-based foams, e.g. polystyrol, pack them in cardboard boxes, then to send them to the manufacturer of the electrical coils. The customer then removed the pin coil formers manually from the foam carriers, placed them on the coil winding machine, manually or with circular or linear conveyors, then conveyed them to the assembly devices, after they had been wound and soldered, by means of conveyor devices which varied considerably according to the coil manufacturer. The fully assembled electrical coils were finally sent to the customer in packing materials developed by the company for this purpose.

The primary objective of this invention is to provide a rack which is suitable for semi-finished and finished products, and particularly for the conveyance of electrical coil formers, from one processing machine to another processing machine, and which is also suitable for the packing of the fully wound, soldered coil. This rack, which may be used as a conveying and packing rack, should also protect the coil formers, primarily pin coil formers with pointed connection pins, against damage, and should in particular also prevent the pins from bending, breaking and prevent the coil former flanges from breaking due to improper transport.

SUMMARY OF THE INVENTION

In order to achieve this objectiv, the invention provides, in the case of a rack of the type already mentioned, that the clearance height a of the sectional rail is chosen equal to or slightly greater than the height of the finished product, which height can be reduced to clearance height b by inserting a strip, e.g. a cardboard strip, to the height of the semi-finished product.

This rack may be adapted very simply to the different heights of the semi-finished and finished products, merely by inserting or removing the strip. This rack is also characterised by excellent guidance of the parts in the rack. If a rack is used with a sectional rail enclosed on all sides, the wall thickness of the sectional rail may also be considerably reduced, whilst nevertheless retaining considerable dimensional stability of the rack under torsional stress.

For inserting the strip in the sectional rail, the lateral walls of the sectional rail are provided, at a suitable distance from the bottom section, with guide rails which may be designed as struts, which are shaped to the lateral inner walls of the sectional rail.

The guide rails are in the case arranged at a distance from the bottom section of the sectional rail which roughly corresponds to the difference between the heights of the finished and semi-finished product.

For stacking several racks, the lateral surface of each sectional rail, facing away from the bottom section, should preferably be designed with a recess in which the next sectional rail is guided by means of its bottom section. This provides perfect, dimensionally stabilizing stacking of the racks.

The rack described above is suitable not only as packing, e.g. for unwound coil formers and for finished coils, but also for electrical components and accessories for these components of similar shape, and as a workpiece carrier it replaces expensive, type-specific feed systems and machine devices. For instance, when used for coil formers and finished coils, the rack may be placed on the automatic winding machines without the insertion of several elements, provided that the rack and feed to the automatic winding machines are suitably designed, with the result that the coil formers can be removed directly. This therefore obviates the need for an expensive and inflexible feed system for the coil formers otherwise mounted on the automatic winding machines, e.g. a circular or linear conveyor. The same rack can pick up the already wound, soldered coil formers again, i.e. the rack may also be used as a workpiece carrier between the winding and series-connected coil assembly. After coil assembly, the finished coils may also be inserted in the same racks, even after the strip is removed from the rack, and forwarded to the dispatch department after being packed in cardboard boxes.

BRIEF DESCRIPTION OF THE DRAWING

Features of the invention and additional objects of the invention will be more readily appreciated and better understood by reference to the following detailed description which should be considered in conjunction with the drawing.

The invention is explained in further detail hereinafter with reference to an illustrative embodiment of the invention wherein.

DETAILED DESCRIPTION

Figure 1:
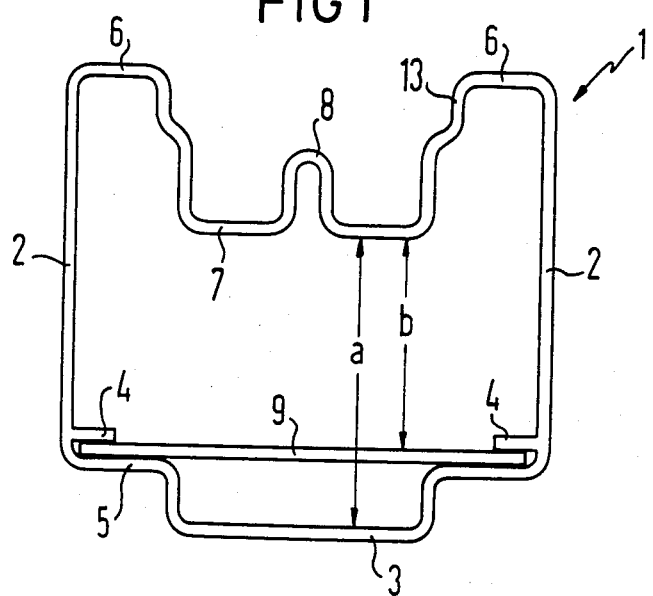
FIG. 1 illustrates a rack according to the invention, in a front view and on an enlarged scale.
Figure 2:
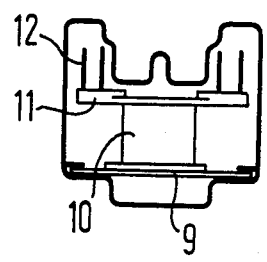
FIG. 2 shows the rack according to FIG. 1 in the same position but with pin coil formers inserted.
Figure 3:
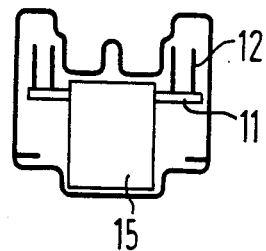
FIG. 3 shows the rack according to FIGS. 1, 2, in the same position, but with the finished coil stored in the rack.

The rack shown in FIGS. 1 through 3 is designed as sectional rail 1, of tunnel-shaped cross-section, which should preferably be adapted to the semi-finished or finished product, e.g. to pin coil former 10, shown in FIG. 2 or the finished electrical coil 15, shown in FIG. 3. Clearance height a of sectional rail 1, i.e. the distance between bottom section 3 and the opposite lateral surface 7, is in this case chosen equal to, or slightly greater than, the height of the finished product, namely electrical coil 15. By inserting a strip 9, e.g. a cardboard strip, into suitable guide rails 4, 5, the above-mentioned height can be reduced to clearance height b corresponding to the semi-finished product, namely pin coil former 10.

The guide rails may be designed as struts which are shaped to lateral walls 2. It is also conveivable—as shown in FIGS. 1 to 3—for some of the elements of the guide rails to be designed as struts 4, and the other elements of these guide rails to be formed by bottom sections 5, which are formed by stepped reduction of bottom section 3.

Lateral surfaces 7 of sectional rail 1 is provided with recesses 6, 6, for receiving coil former pins 12 inserted in coil former flanges 11. An additional recess 8 may also be used as a further guide element for the electrical coil or electrical coil formers.

For stacking several racks, the lateral surface of each sectional rail 1, facing away from bottom section 3, is designed with recesses 13, into which each succeeding sectional rail 1 is guided by means of its bottom section 3. This ensures mechanically stable, and in particular rigid stacking.

There has thus been shown and described a productions rack which fulfills all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claim which follow.

I claim:

1. A rack for semi-finished and finished products, particularly for electrical pin coil formers with coil former pins secured to a coil former flange, and for coils fitted with these coil formers, suitable for use both as a conveyor track for the semi-finished product (pin coil formers) and as a packaging rack for the finished products (coils), the rack comprising a sectional rail with a tunnel-shaped cross-section generally adapted to the product, the rack further comprising means for adjusting the clearance height of the sectional rail between a first predetermined value of a essentially being equal to slightly greater than the height of the finished product and a second predetermined value of b essentially being equal to slightly greater than the height of the semi-finished product, and the means for adjusting comprising a strip adapted for insertion into said rack.

2. A rack according to claim 1, further comprising lateral walls of the sectional rail being provided at a suitable distance from the bottom section, the means for adjusting comprising guide rails for guiding the strip formed into said lateral walls, and the strip comprises insulative material.

3. A rack according to claim 1, further comprising the guide rails being designed as struts which are shaped to correspond to the lateral inner walls of the sectional rail.

4. A rack according to claim 1, wherein the means for adjusting comprises guide rails arranged at a distance from the bottom section which is substantially equivalent to the difference between the heights of the finished and semi-finished product.

5. A rack according to claim 2, wherein the guide rails are arranged at a distance from the bottom section which is substantially equivalent to the difference between the heights of the finshed and semi-finished product.

6. A rack according to claim 3, wherein the guide rails are arranged at a distance from the bottom section which is substanially equivalent to the difference between the heights of the finished and semi-finished product.

7. A rack according to claim 1, wherein the upper surface of the sectional rail facing away from the bottom section is provided with recesses for receiving the coil former pins of the pin coil formers.

8. A rack according to claim 1, wherein the bottom section is stepped into sections facing each other inside the lateral walls and that these steps form sections of the guide rails.

9. A rack according to claim 1, wherein the upper surface of each sectional rail, facing away from the bottom section, includes a recess adapted to mate with a portion of a bottom section of another rack of the same form for stacking several racks.

* * * * *